US012797919B2

(12) United States Patent
Jelic et al.

(10) Patent No.: US 12,797,919 B2
(45) Date of Patent: Nov. 17, 2026

(54) ULTRAVIOLET SPECIMEN CLEANING APPARATUS

(71) Applicant: JELIGHT COMPANY, INC., Irvine, CA (US)

(72) Inventors: Marinko Jelic, Irvine, CA (US); Andrew Mackinnon, Irvine, CA (US); Rey Bangco, Irvine, CA (US)

(73) Assignee: Jelight Company, Inc., Irvine, CA (US)

( * ) Notice: Subject to any disclaimer, the term of this patent is extended or adjusted under 35 U.S.C. 154(b) by 586 days.

(21) Appl. No.: 17/091,424

(22) Filed: Nov. 6, 2020

(65) Prior Publication Data

US 2022/0143657 A1 May 12, 2022

(51) Int. Cl.

| | |
|---|---|
| ***B08B 7/00*** | (2006.01) |
| ***G03F 7/42*** | (2006.01) |
| ***H10P 72/00*** | (2026.01) |
| ***H10P 72/76*** | (2026.01) |

(52) U.S. Cl.

CPC .......... *B08B 7/0057* (2013.01); *B08B 7/0035* (2013.01); *G03F 7/42* (2013.01); *H10P 72/0406* (2026.01); *H10P 72/0436* (2026.01); *H10P 72/7612* (2026.01); *H10P 72/7624* (2026.01)

(58) Field of Classification Search

CPC ................ B08B 7/0057; B08B 7/0035; H01L 21/67115; H01L 21/68785; G03F 7/42

USPC .......................................................... 134/133

See application file for complete search history.

(56) References Cited

U.S. PATENT DOCUMENTS

| | | | | |
|---|---|---|---|---|
| 6,437,290 B1 * | 8/2002 | Shao | C30B 31/12 | 118/724 |
| 2002/0105275 A1 * | 8/2002 | Shigeoka | H01K 1/325 | 313/635 |
| 2002/0150395 A1 * | 10/2002 | Shimizu | H01L 21/67115 | 219/390 |
| 2008/0230721 A1 * | 9/2008 | Matsushita | H01L 21/67115 | 250/492.2 |
| 2011/0174790 A1 * | 7/2011 | Suzuki | H01L 21/67115 | 219/121.84 |
| 2015/0259786 A1 * | 9/2015 | Ko | B41J 2/01 | 118/620 |
| 2018/0340832 A1 * | 11/2018 | Hawrylchak | H01L 21/324 | |
| 2018/0350595 A1 * | 12/2018 | Srinivasan | H01L 21/02348 | |
| 2020/0009597 A1 * | 1/2020 | Ko | B05C 15/00 | |
| 2021/0013064 A1 * | 1/2021 | Yoon | H01L 21/67115 | |
| 2021/0197224 A1 * | 7/2021 | Abe | H01L 21/02628 | |

* cited by examiner

*Primary Examiner* — Levon J Shahinian

(74) *Attorney, Agent, or Firm* — Smyrski Patent Law PC

(57) ABSTRACT

An apparatus for cleaning a sample is provided. The apparatus includes an ultraviolet grid lamp having a forward side, the ultraviolet grid lamp configured to direct ultraviolet light energy from its forward side toward the sample, a quartz plate positioned between the forward side of the ultraviolet grid lamp and the sample, and a nitrogen circulating arrangement configured to circulate nitrogen along the ultraviolet grid lamp.

20 Claims, 9 Drawing Sheets

ULTRAVIOLET SPECIMEN CLEANING APPARATUS

BACKGROUND OF THE INVENTION

Field of the Invention

The present invention relates generally to the field of cleaning devices, and more specifically to ultraviolet (UVO) cleaning devices.

Description of the Related Art

The UVO method is employed to clean certain specimens, including semiconductor wafers. The UVO method is a photo-sensitized oxidation process in which the contaminant molecules of photoresists, resins, human skin oils, cleaning solvent residues, silicone oils, and flux are excited and/or dissociated by the absorption of short-wavelength UV radiation. Atomic oxygen is simultaneously generated when molecular oxygen is dissociated by 184.9 nm and ozone by 253.7 nm UV. Most hydrocarbons and ozone absorb the 253.7 nm UV radiation. The products of this excitation of contaminant molecules react with atomic oxygen to form simpler, volatile molecules which desorb from the surface. Therefore, when both UV wavelengths are present, the UVO process continuously generates atomic oxygen and ozone is continually formed and destroyed.

Properly placing pre-cleaned samples within five millimeters of an ozone producing UV source, such as a low-pressure mercury vapor UV Grid lamp, enables near atomically clean surfaces in less than one minute. The process does not damage sensitive device structures on semiconductor wafer surfaces such as MOS gate oxide.

Previously available UVO cleaners have one or more high-intensity low pressure mercury vapor UV Grid lamps for optimum generation of atomic oxygen and short-wave UV radiation for effective cleaning. To maximize the cleaning rate, parts to be cleaned are placed on an adjustable tray. Prior units have been equipped with inlet ports for oxygen or other gas media, and an exhaust port for hookup to an exhaust system. Such devices have employed a single chamber wherein all cleaning functions required are performed with the sample located at a single position in the device.

Issues with these prior devices are speed of cleaning. While the most advanced UVO cleaners currently available require less than one minute to clean a properly pre-cleaned sample, applications such as the removal of photoresist may require significantly longer cleaning times. Including the time to load, process, and unload, a savings of seconds can be highly beneficial. Faster processing is highly advantageous in this field. Prior devices vary in processing times and construction, with some UVO cleaning devices being self-contained and others comprising a series of stations applying the necessary steps described.

Self-contained devices performing UVO cleaning are limited due to typical mechanical concerns, primarily heat. While bigger and more powerful components could be used, when such components are installed, the heat generated can adversely affect other components, cleaning can be slowed, or the process may even harm the sample in extreme cases. The challenge is therefore to obtain improved performance while both guarding against problems with the device and keeping the device self-contained and relatively small in size.

It would therefore be desirable to offer a UVO processing device that improves on the processing time of a given sample. Such a device would be preferably self contained and relatively efficient as compared with prior designs.

SUMMARY OF THE INVENTION

Thus according to a first embodiment, there is provided an apparatus for cleaning a sample comprising an ultraviolet grid lamp having a forward side, the ultraviolet grid lamp configured to direct ultraviolet light energy from its forward side toward the sample, a quartz plate positioned between the forward side of the ultraviolet grid lamp and the sample, and a nitrogen circulating arrangement configured to circulate nitrogen along the ultraviolet grid lamp.

According to another embodiment, there is provided an apparatus for cleaning a sample comprising an ultraviolet grid lamp having a forward side, the ultraviolet grid lamp configured to direct ultraviolet light energy from its forward side toward the sample, a quartz plate positioned between the forward side of the ultraviolet grid lamp and the sample, and a fan arrangement configured to cool the ultraviolet grid lamp by receiving and passing nitrogen in a path proximate the ultraviolet grid lamp.

According to a further embodiment, there is provided an apparatus for cleaning a specimen comprising an ultraviolet grid lamp having a forward side, the ultraviolet grid lamp configured to direct ultraviolet light energy from its forward side toward the specimen, a quartz plate positioned between the forward side of the ultraviolet grid lamp and the specimen, and a nitrogen circulating arrangement configured to circulate nitrogen along the ultraviolet grid lamp.

These and other advantages of the present invention will become apparent to those skilled in the art from the following detailed description of the invention and the accompanying drawings.

BRIEF DESCRIPTION OF THE DRAWINGS

For a more complete understanding of the present disclosure, reference is now made to the following figures, wherein like reference numbers refer to similar items throughout the figures.

DETAILED DESCRIPTION

The following description and the drawings illustrate specific embodiments sufficiently to enable those skilled in the art to practice the system and method described. Other embodiments may incorporate structural, logical, process and other changes. Examples merely typify possible variations. Individual elements and functions are generally optional unless explicitly required, and the sequence of operations may vary. Portions and features of some embodiments may be included in, or substituted for, those of others.

The present design is a relatively small, self contained design similar in size to previous UVO cleaning devices that provides improved cleaning capability. The present device includes a unique cooling system, wherein a nitrogen atmosphere is employed to achieve a beneficial result, and a quartz plate that provides beneficial heating qualities. The present design may include a heated tray in one embodiment that speeds processing. The result is a device that provides cleaning in less time than previously achievable.

Figure 1:
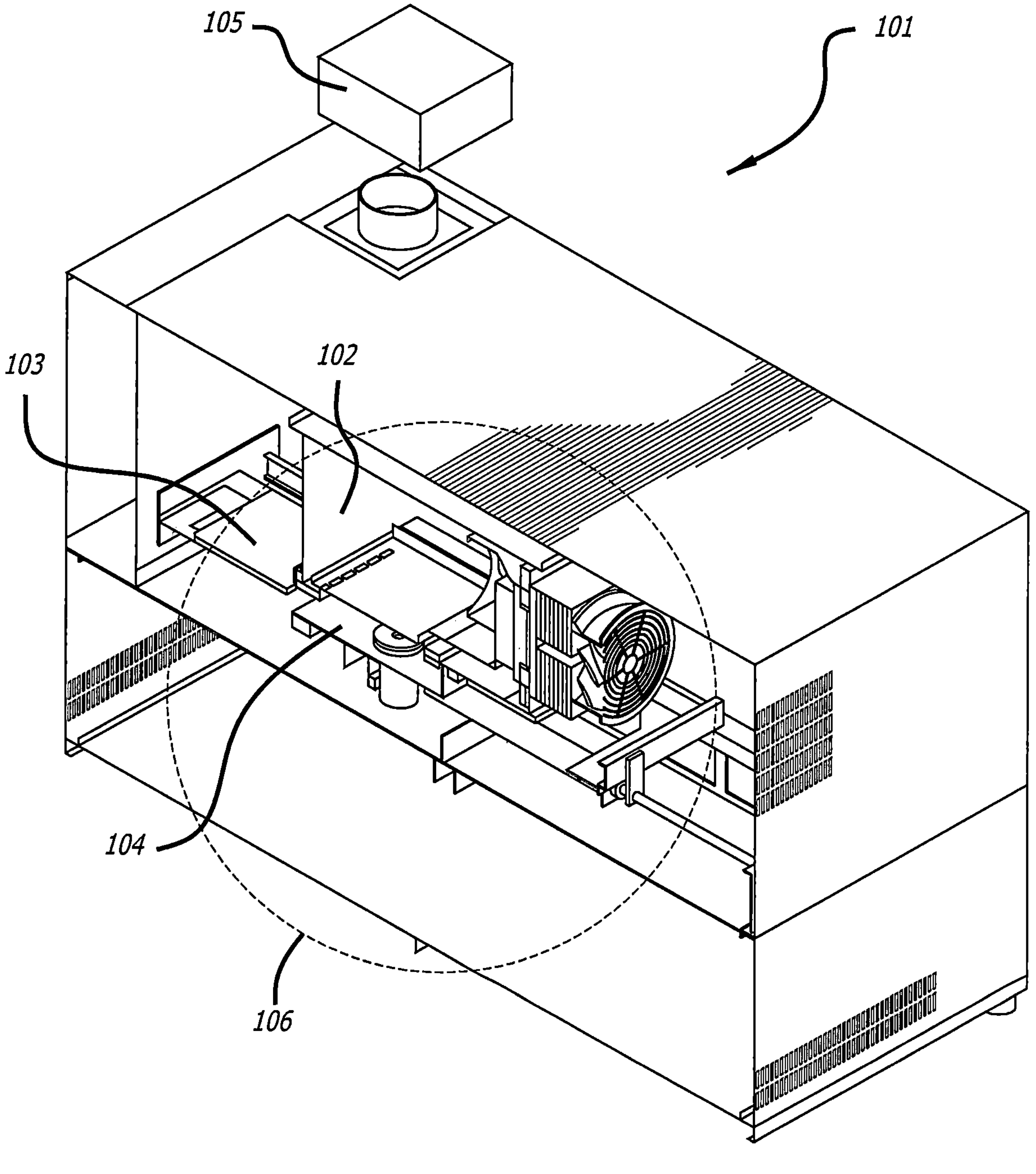
FIG. 1 illustrates a cutaway view of an embodiment of the present design.

FIG. 1 is a general overview of the design. FIG. 1 shows UVO cleaning device 101 used to clean samples, such as a substrate of size 7 inches by 7 inches by ¼ inch. Other types of samples or substrates may be cleaned, including substrates of different dimensions. The primary function of the device is to strip photo-resist materials from the sample. The cleaning process is performed in a pressurized gaseous environment including air, oxygen, ozone, or combination thereof. UVO cleaning device 101 includes lamp chamber 102 which fills with nitrogen, and substrate tray 103 that moves the sample into position in cleaning chamber 104. Ozone filter 105 is shown, and in this view internal components 106 are shown and expanded in further detail in FIG. 2.

Figure 2:
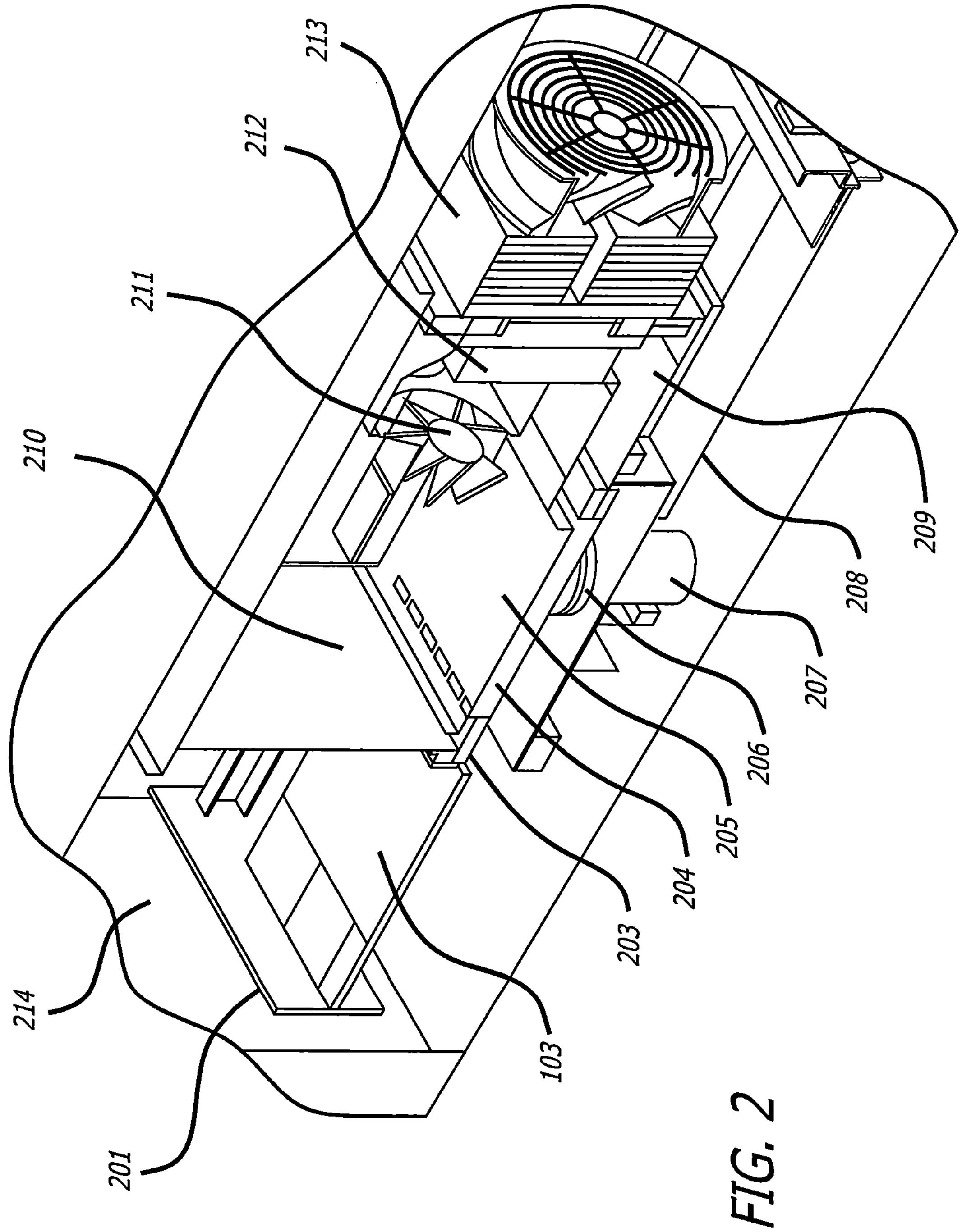
FIG. 2 is an expanded view of components of particular interest in the present design.

FIG. 2 includes drawer 201 that is used to both load and unload the substrate sample (not shown in this view). Substrate tray 103 is provided and may be heated to facilitate the cleaning process, as heating the substrate tray 103 and substrate prepares the substrate for processing and can decrease cleaning time. Quartz plate 203 is provided as well as UV Grid lamp 204, positioned below reflector 205. Lifting pedestal 206 receives the sample from substrate tray 103, wherein the substrate tray 103 acts as a movable sample loader or loading mechanism for the sample, and raises the sample toward the UV Grid lamp 204 by pedestal cylinder 207. Drawer cylinder 208 and ductwork 209 are also shown in this view. Surface 210 is shown, establishing the boundary of lamp chamber 102. Cooling fan 211, heat sink 212, and hot/cold plate 213 are also 1 illustrated.

Figure 3:
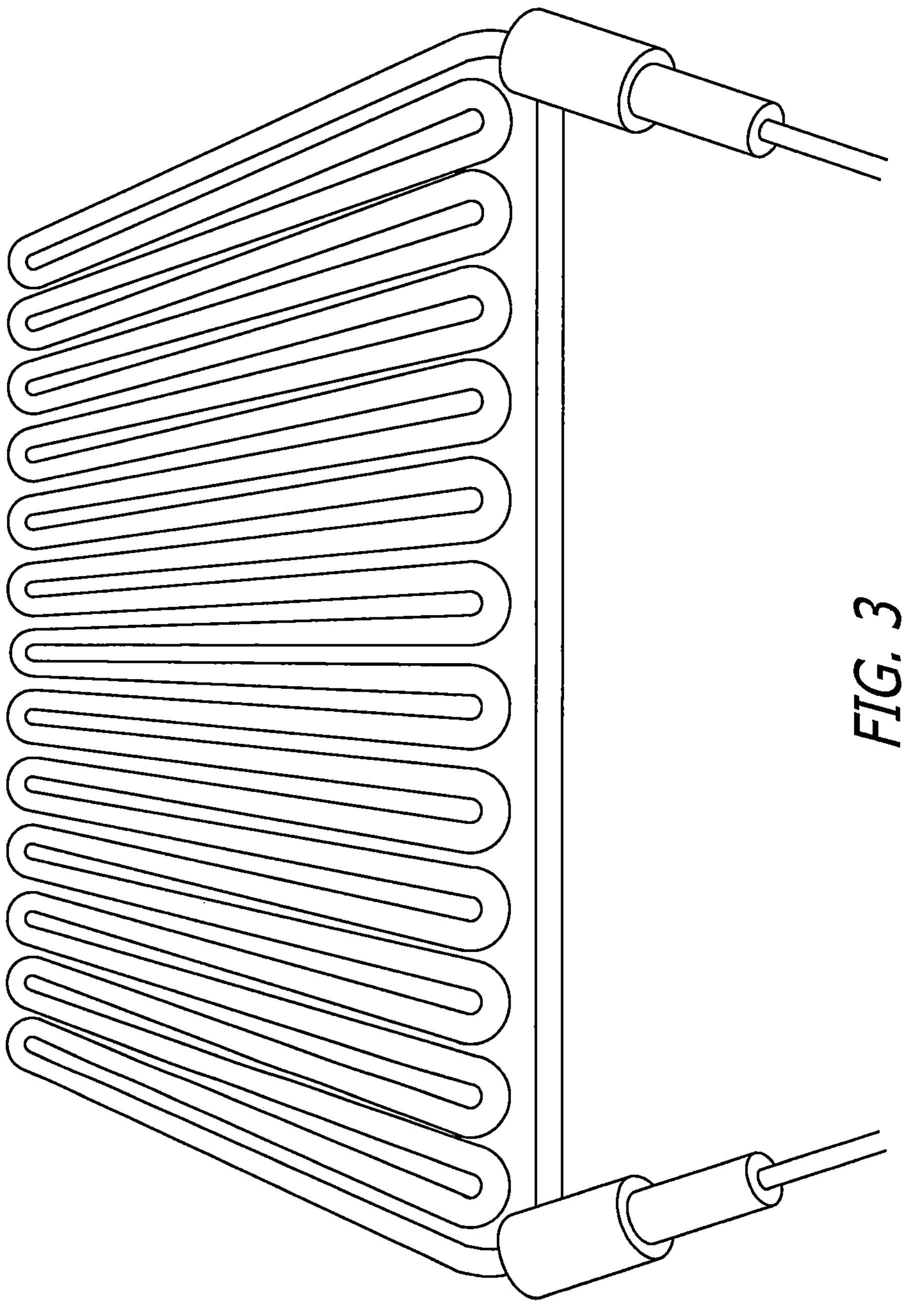
FIG. 3 illustrates an example of a UV Grid lamp that may be employed in the present design.

The UV Grid lamp 204 is a high intensity UV lamp with densely packed, small diameter tubing. Bends are formed to enable a very tight tube radius and a minimal gap between tubes. Relatively small electrodes can provide the most consistent high UV output. One example of a UV Grid lamp that may be employed in such a design is shown in FIG. 3. Such UV Grid lamps are known and generally available.

In one embodiment, the UV Grid lamp 204 is powered by a ballast usable in larger lamps. Use of this larger ballast provides a relatively high electrical output as compared with standard power supplies, further increasing UV intensity. As compared with previous lamps in similar devices, the current lamp intensity is greater, and in one embodiment approximately 2.5 times greater per given area.

The higher power applied to the UV Grid lamp 204 causes the lamp to generate significantly more heat than previous designs. The higher temperatures adversely affect lamp performance, thus reducing UV emissions. Heat also leads to increasing lamp pressure and voltage that the power supply eventually cannot support, resulting in shutdown of UV Grid lamp 204. To keep the lamp temperature within an acceptable operating range, the system employs a unique cooling system that recirculates air along the lamp body using cooling fans and ductwork.

Recirculating the air around the lamp body increases the likelihood of unwanted particles inside the cleaning chamber. Keeping out dust and foreign particles is critical to the process, particularly in semiconductor cleaning applications. To prevent moving particles from coming contact with the substrate, the process chamber of the present design comprises two chambers, an upper lamp chamber and a lower process (cleaning) chamber. Dividing these two chambers is quartz plate 203 with O-ring seals (not shown) on both sides secured with a stainless-steel flange or frame (also not shown)). Quartz plate 203 in one embodiment includes synthetic quartz material that facilitates high transmission of shortwave UV radiation.

Figure 4:
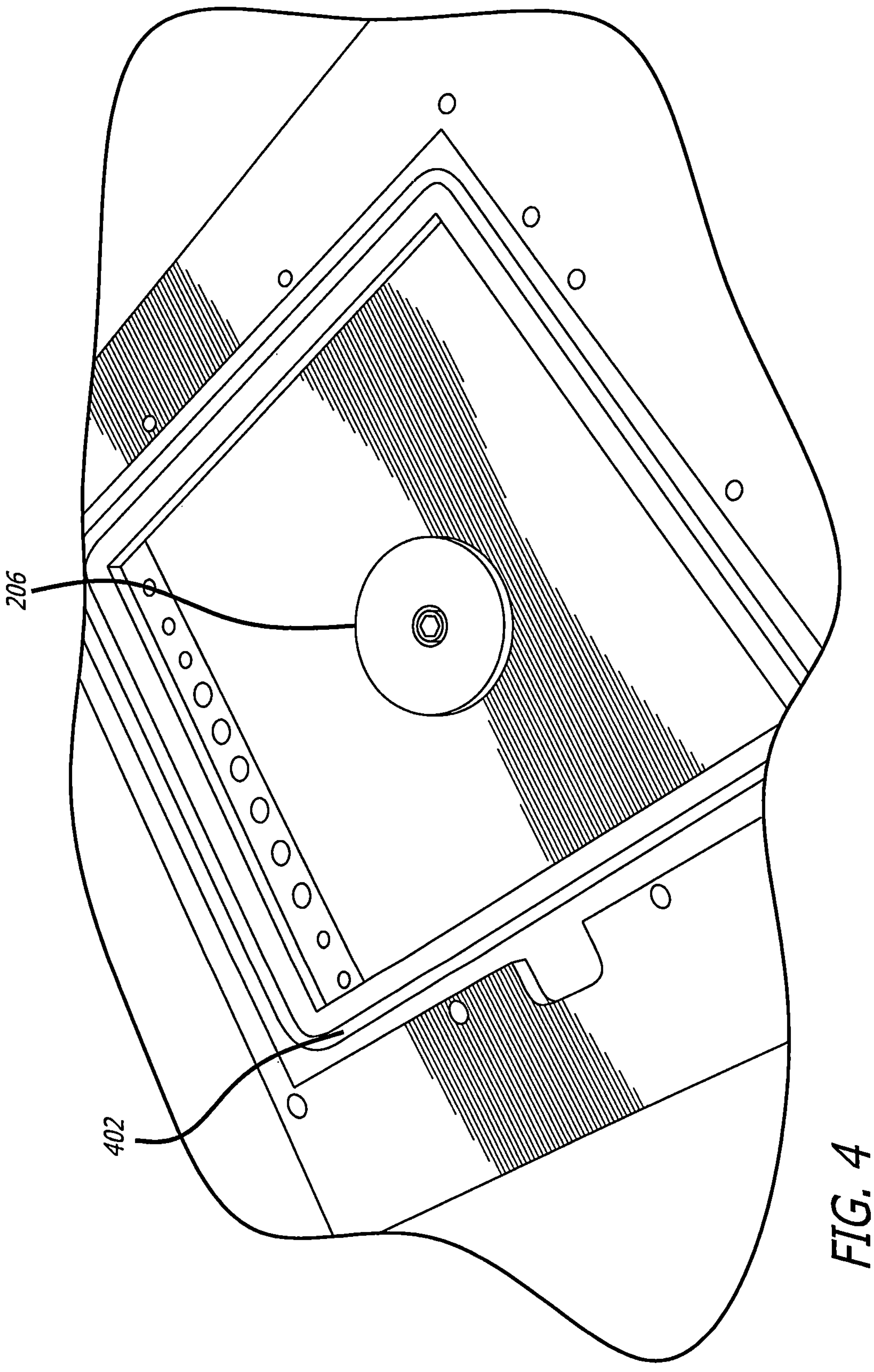
FIG. 4 shows a pedestal or lifting pedestal and an O-ring groove for the quartz plate.
Figure 5:
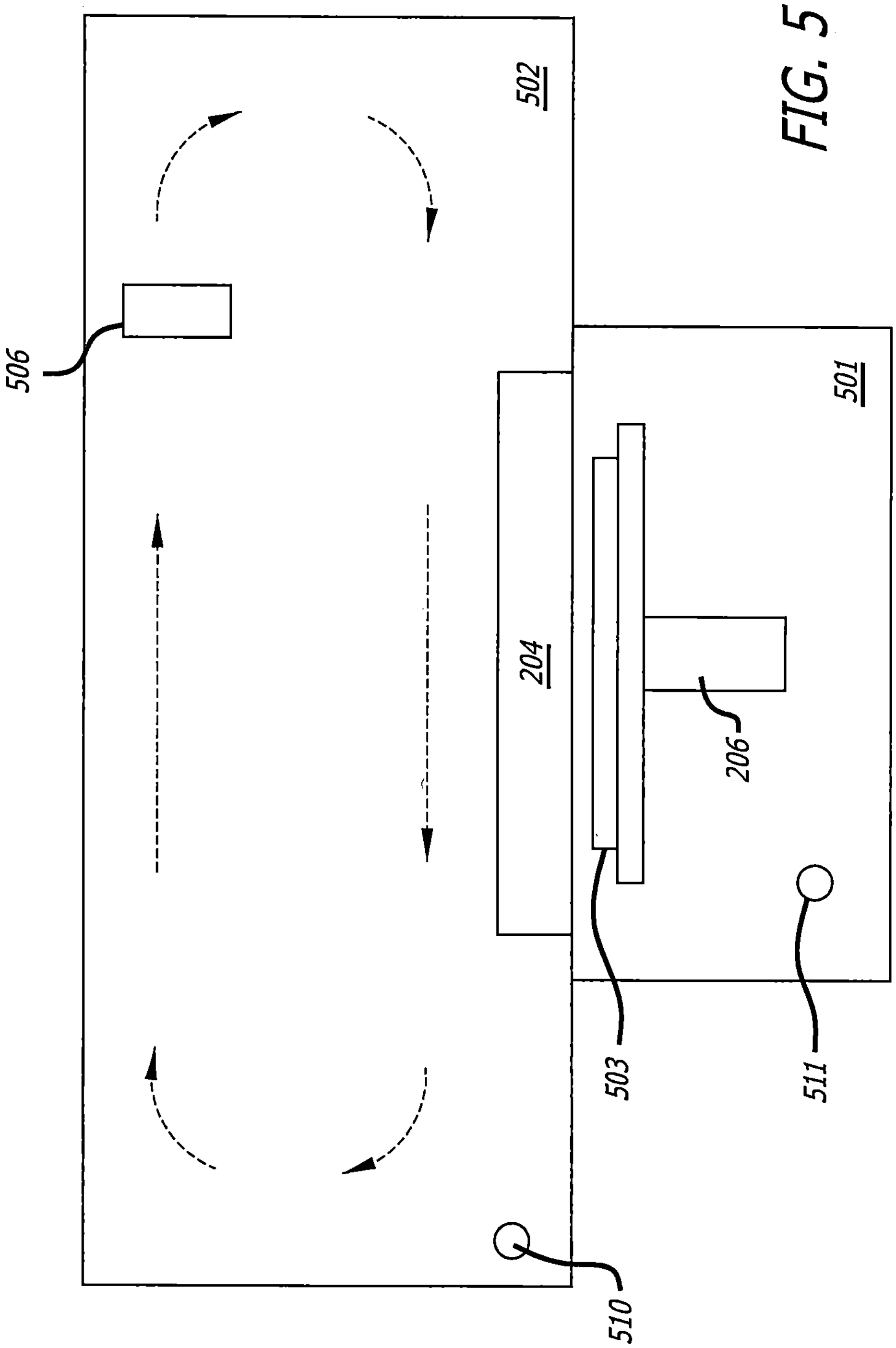
FIG. 5 shows a conceptual representation of a part of the design, including a lower chamber, a housing sample, an upper (lamp) chamber, and the UV Grid lamp.

FIG. 4 shows pedestal or lifting pedestal 206 and the O-ring groove 402 for the quartz plate 203 (not shown in this view). FIG. 5 shows a conceptual representation of a part of the design, including lower chamber 501 that includes sample 503 atop pedestal 206, upper (lamp) chamber 102, and UV Grid lamp 204. Also shown in this view is fan arrangement 506, representing a fan arrangement such as the dual fan arrangement shown in FIG. 8, that directs nitrogen through the upper (lamp) chamber 502 and represents a fan arrangement performing circulation of nitrogen. Several elements are not shown in this view, including a specimen tray and a quartz plate, and it is provided to understand the basic cooling and arrangement between regions wherein different pressurization may be employed.

The cooling system in this embodiment includes a hot/cold plate 213 that employs the Peltier effect. The Peltier effect calls for application of voltage to two electrodes connected to semiconductor or similar material. The result is the transfer of heat from one medium or material to another. Development of condensation can negatively affect many types of heat exchangers. In addition to moisture, a high concentration of ozone generated by the UV Grid lamp 204 can lead to corrosion and premature failure of electrical components such as the cooling fans, electrical wires and lamp terminals. In the present design, the upper (lamp) chamber is filled with nitrogen, reducing ozone generation inside the lamp chamber. The result is a decreased moisture content in the cooling media. Decreased moisture content reduces corrosion in electronic and electrical components. In some instances, the UV Grid lamp and/or the substrate may be preheated using the using hot/cold plate 213.

The system pressurizes the lower chamber 501 during the cleaning process, wherein the cleaning process employs air, oxygen, and/or ozone, or a combination thereof. Force acting upon the quartz window limits the maximum pressure available from such pressurization. A thicker quartz plate 203 provides lower UV transmission. The system operates such that the pressure in both upper (lamp) chamber and lower (cleaning) chamber can be increased in one while simultaneously decreasing pressure in the other to minimize the pressure differential between chambers. Sensors are provided, shown as sensors 510 and 511 in FIG. 5, and readings from the sensors can be used to balance pressures such that an excessive pressure differential may be achieved and/or maintained. In one embodiment, the lower pressure chamber is kept at a lower cleaning pressure, such as half the desired cleaning pressure. The system's pressure balancing functionality reduces the pressure differential on quartz plate 203. The ability for the system to provide a static pressure in the lamp chamber reduces nitrogen usage.

One possible cleaning distance between the substrate or sample and UV Grid lamp 204 is nonzero, in one embodiment less than ¼ inch. In one embodiment, quartz plate 203 below the UV Grid lamp 204 is ⅛ inch thick with a sealing flange around quartz plate 203 about ⅜ inch thick, but other dimensions may be provided depending on various factors. An operator may load the sample or substrate onto substrate tray 103 for the cleaning process. The substrate tray 103 may be loaded manually or automatically into drawer 201. The system may include, for example, an air cylinder 208 that closes the drawer, but other devices may be employed such as linear motion slide. In one embodiment the drawer has an O-ring providing an airtight seal against the exterior housing 214. The substrate or sample is positioned below the UV Grid lamp 204. However, the distance between the substrate and UV Grid lamp 204 may be too large to perform a rapid and effective cleaning of the substrate because the O-ring seals around the underside of the quartz plate occupy the space needed to load the substrate tray 103 at an acceptable distance from the UV Grid lamp 204 to provide effective and efficient cleaning.

Thus the system employs vertical positioning. The system vertically positions the substrate using lifting pedestal 206 rising from beneath the substrate tray 103. Lifting pedestal 206 is driven by an air cylinder 207, but alternative devices such as a linear motion slide could be employed. The lifting mechanism raises the substrate tray and substrate or sample while gas is being provided to the system, such as the aforementioned air, oxygen, and/or ozone, or any combination thereof, in one embodiment prior to ignition of the UV Grid lamp 204.

In some situations, the system may heat the substrate tray 103 and subsequently the substrate. This may be beneficial for some cleaning methods such as the stripping of photo resist.

Figure 6:
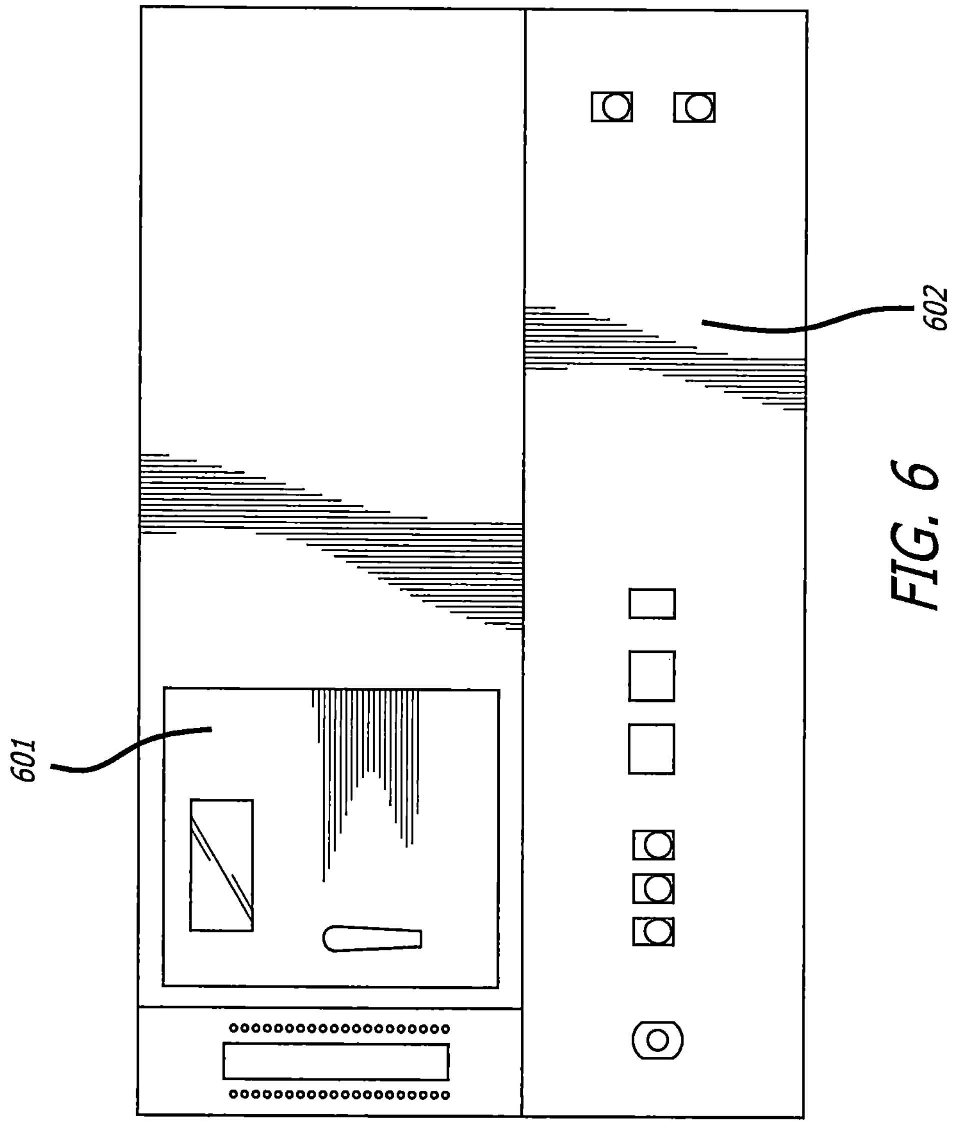
FIG. 6 is a view of an exterior of one embodiment according to the current design.

FIG. 6 is a view of a candidate machine showing load door 601 and housing 602. The machine in one embodiment has a pneumatically operated opening/closing drawer located behind a door on the cabinet front panel in one embodiment, and the machine is further equipped with an interlock system to ensure the door has adequate air pressure to remain sealed in the closed position and cannot be manually opened before the system empties gas from the chamber.

The cleaning process time can be varied and the exhaust process can also be adjusted. Ozone is drawn through a catalyst material and destroyed.

Of particular interest in the present design is the use of a nitrogen atmosphere and the path of nitrogen through the system, the ability to balance pressures, and the use of the quartz plate. The higher intensity lamp is also noteworthy, as it puts out more UV energy than previously employed, and requires the advanced cooling system disclosed herein.

Figure 7:
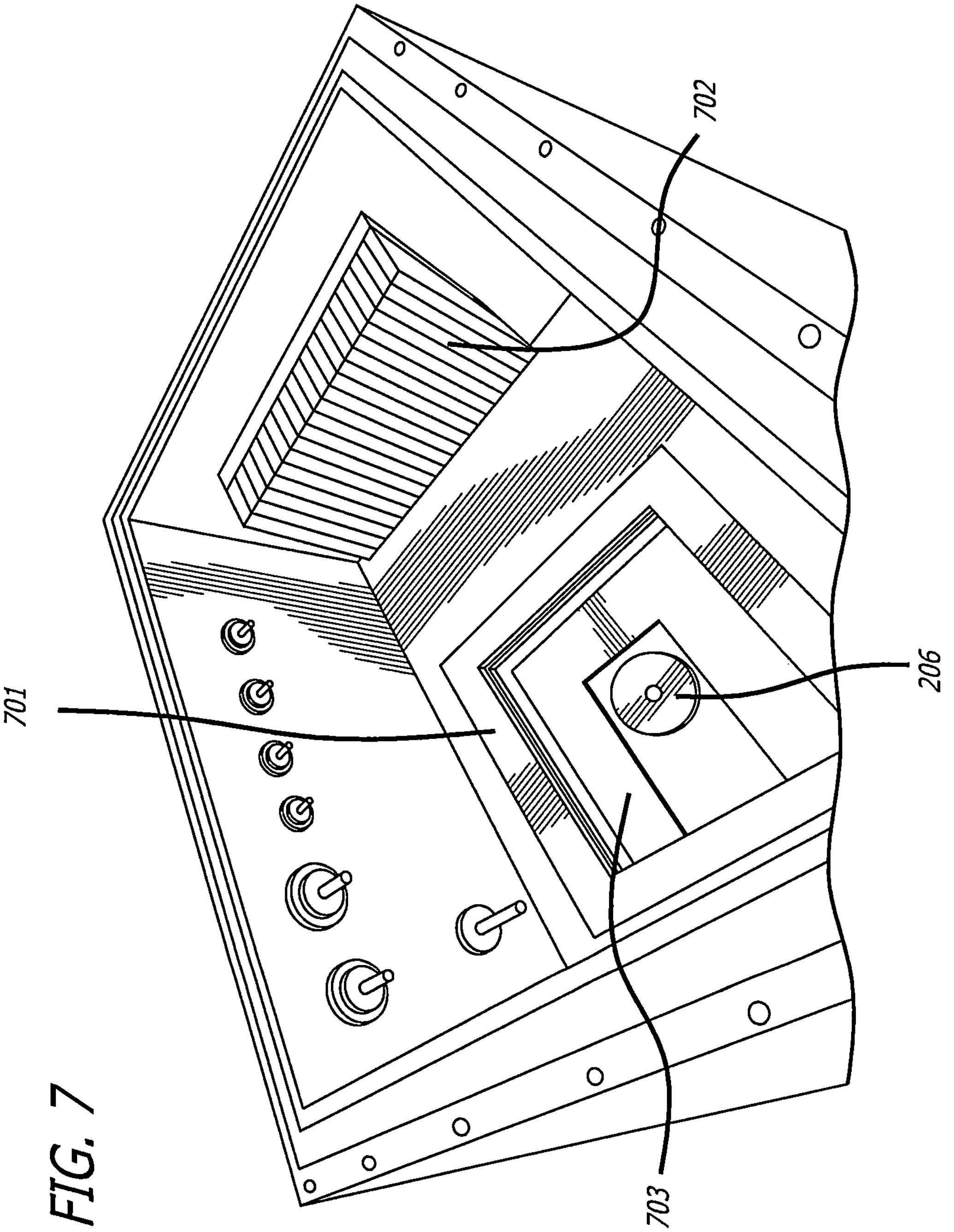
FIG. 7 illustrates the interior of the lamp chamber showing the sealing flange for the quartz plate (not shown in this view) as well as the heatsink for the hot/cold plate.
Figure 8:
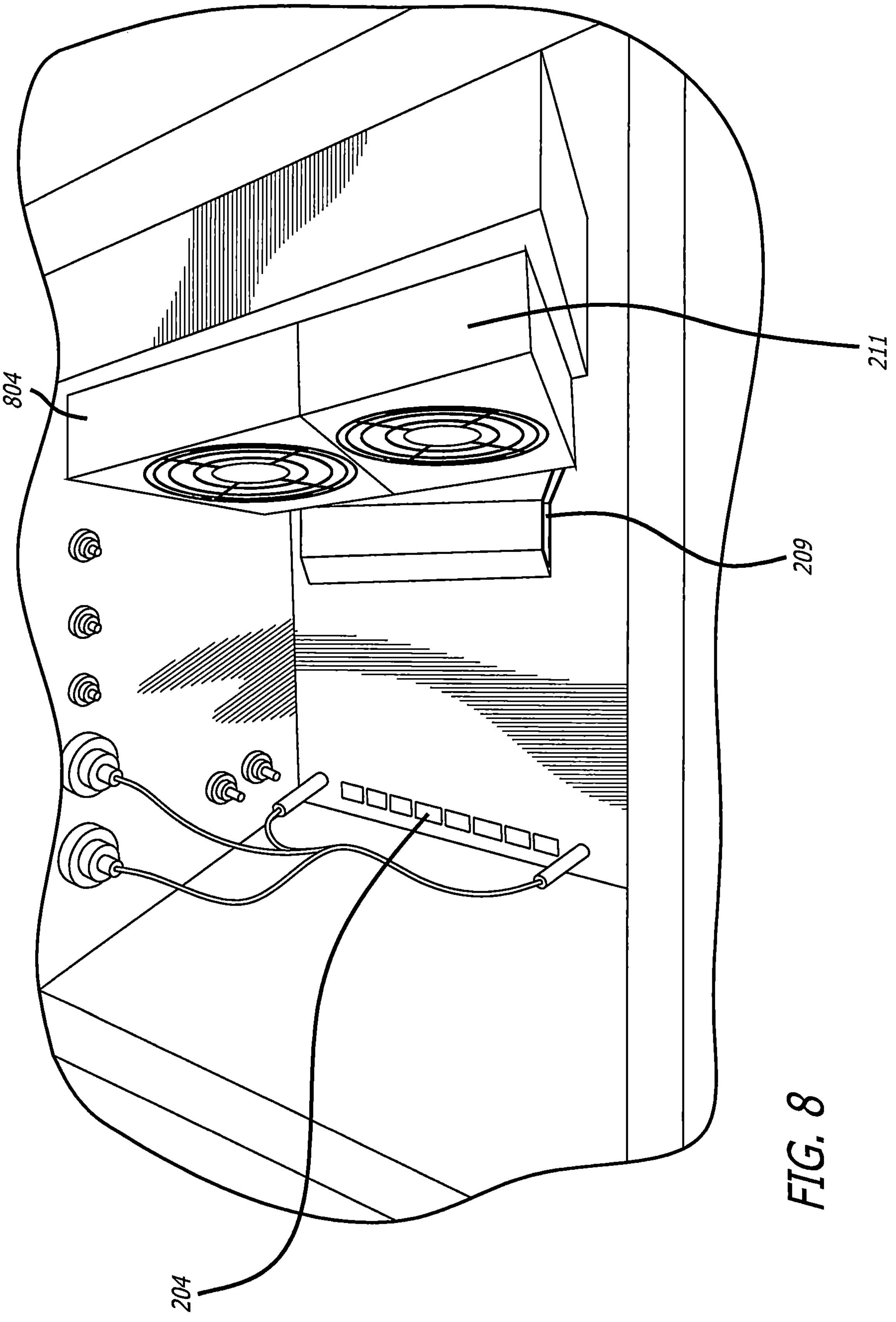
FIG. 8 illustrates the inside of the lamp chamber with the UV Grid lamp shown connected to power sources, with the tubes of the UV Grid lamp not shown in this view, as well as ductwork and fans.

FIG. 7 illustrates the interior of the lamp chamber showing the sealing flange 701 for the quartz plate (not shown in this view) as well as the heatsink 212 for the hot/cold plate 213. Also shown is lifting pedestal 206 and drawer bottom 703, shown without tray, where the pedestal cylinder is not shown in this representation. FIG. 8 illustrates the inside of the lamp chamber with UV Grid lamp 204 shown connected to power sources, with the tubes not shown in this view, as well as ductwork 209, fan 211, and second fan 804. A single fan or combination of fans, such as fan 211 and second fan 804, represent a nitrogen gas flow director operating as part of a nitrogen circulating arrangement.

Figure 9:
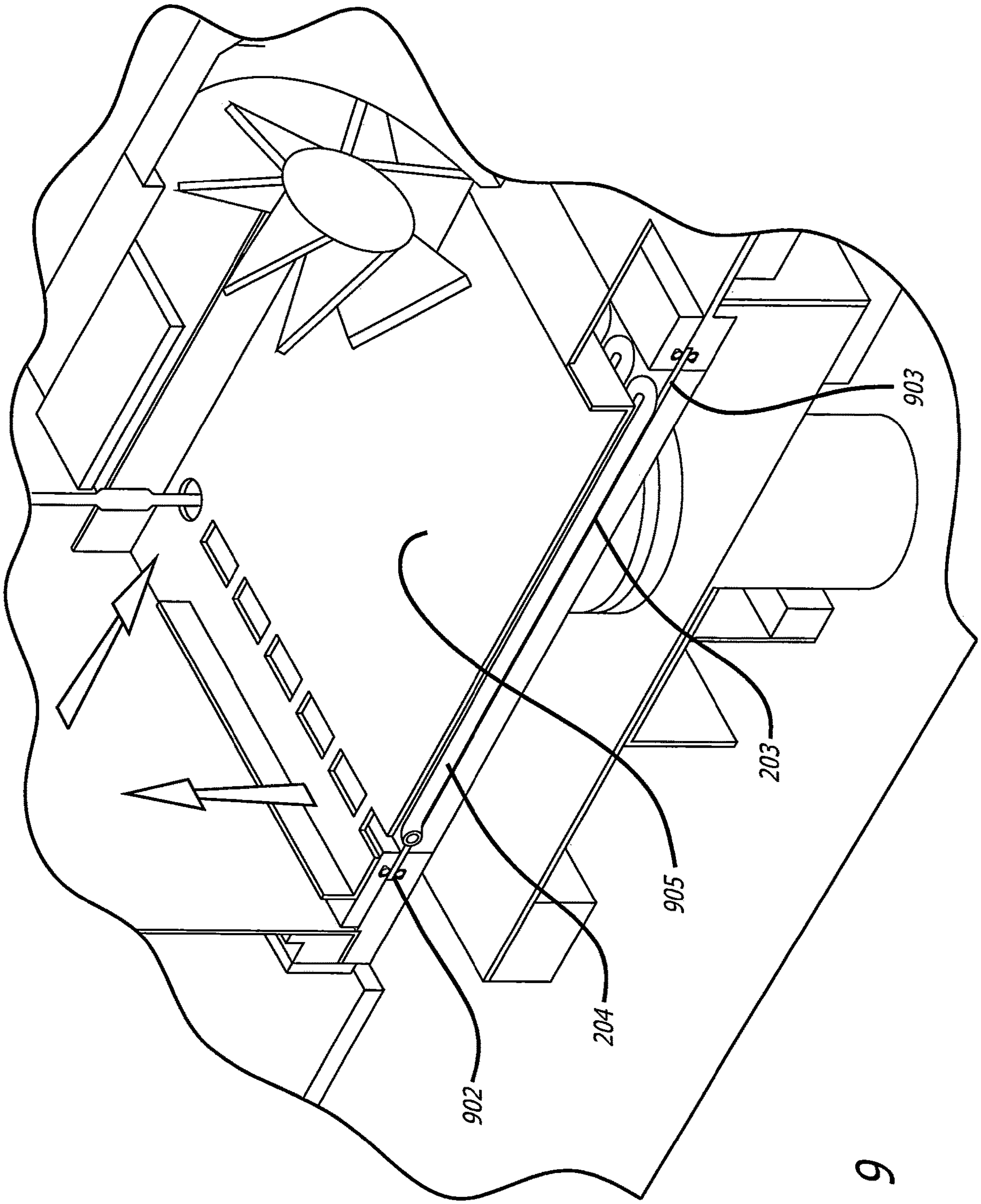
FIG. 9 is a close view showing certain details of the quartz plate and UV grid lamp employed in one embodiment of the design.

FIG. 9 is a closer version of certain aspects of the present design, showing quartz plate 203, having quartz plate ends or corners 902 and 903, with an outer tube of UV grid lamp 204 shown, as well as reflector 905. The representation of FIG. 9 shows a closer version of the construction of UV grid lamp 204 and the quartz plate 203, and as may be appreciated, nitrogen provided to the UV grid lamp 204 passes directly over or proximate the UV grid lamp 204 before being redirected upward in the representation shown.

As noted, the sample or substrate is placed on substrate tray 103 and loaded via drawer 201, which then transitions to lifting pedestal 206 and is raised by pedestal cylinder 207. Both the substrate tray 103 and substrate may be heated. The sample is located a nonzero distance from UV Grid lamp 204 by upward motion of pedestal cylinder 207 and lifting pedestal 206. Once in position, the sample or substrate is in position with quartz plate 203 positioned between the sample and UV Grid lamp 204. UV Grid lamp 204 may be turned on, generating a significant amount of heat. Nitrogen may be provided to the system and nitrogen may be pumped in and out of the system or may be provided in the system and circulated, and periodically changed as necessary. Nitrogen may pass through heat sink 212, along ductwork 209, and in one embodiment, along reflector 205, then upward when striking the wall adjacent the UV Grid lamp 204. Nitrogen is then drawn by cooling fan 211 and returns to heat sink 212. Hot/cold plate 213 and the associated fan assist in the cooling process. Once the cleaning process has progressed for a period of time, the UV Grid lamp 204 may be switched off and the sample lowered, nitrogen flow may be turned off, and the sample may be retrieved from the device. Typical processing time can depend on the amount of cleaning necessary, but in many cases, a 40 percent decrease or more in processing time may be achieved.

Thus the present design includes an apparatus for cleaning a sample comprising an ultraviolet grid lamp having a forward side, the ultraviolet grid lamp configured to direct ultraviolet light energy from its forward side toward the sample, a quartz plate positioned between the forward side of the ultraviolet grid lamp and the sample, and a nitrogen circulating arrangement configured to circulate nitrogen along the ultraviolet grid lamp.

According to another embodiment, there is provided an apparatus for cleaning a sample comprising an ultraviolet grid lamp having a forward side, the ultraviolet grid lamp configured to direct ultraviolet light energy from its forward side toward the sample, a quartz plate positioned between the forward side of the ultraviolet grid lamp and the sample, and a fan arrangement configured to cool the ultraviolet grid lamp by receiving and passing nitrogen in a path proximate the ultraviolet grid lamp.

According to a further embodiment, there is provided an apparatus for cleaning a specimen comprising an ultraviolet grid lamp having a forward side, the ultraviolet grid lamp configured to direct ultraviolet light energy from its forward side toward the specimen, a quartz plate positioned between the forward side of the ultraviolet grid lamp and the specimen, and a nitrogen circulating arrangement configured to circulate nitrogen along the ultraviolet grid lamp.

The foregoing description of specific embodiments reveals the general nature of the disclosure sufficiently that others can, by applying current knowledge, readily modify and/or adapt the system and method for various applications without departing from the general concept. Therefore, such adaptations and modifications are within the meaning and range of equivalents of the disclosed embodiments. The phraseology or terminology employed herein is for the purpose of description and not of limitation.

What is claimed is:

1. An apparatus for cleaning a sample, comprising:
an upper chamber comprising:
a quantity of non-air nitrogen;
an ultraviolet grid lamp having a forward side and a rear side, the ultraviolet grid lamp directing ultraviolet light energy from its forward side toward the sample;
a nitrogen gas flow director positioned above the ultraviolet grid lamp comprising a set of fans that receives non-air nitrogen and directs the non-air nitrogen in a direction;
an upper chamber first wall positioned in the direction of and in front of the nitrogen gas flow director that deflects configured to receive the non air nitrogen from the non-air nitrogen downward and over the rear side of the ultraviolet grid lamp; and
an upper chamber second wall that receives non-air nitrogen provided toward the rear side of the ultraviolet grid lamp and deflects non-air nitrogen upward and to the set of fans of the nitrogen gas flow director;
wherein the nitrogen gas flow director, upper chamber first wall, and upper chamber second wall circulate non-air nitrogen along the rear side of the ultraviolet grid lamp and around the upper chamber.

2. The apparatus of claim 1, further comprising a lifting pedestal configured to vertically position the sample proximate a quartz plate positioned between the forward side of the ultraviolet grid lamp and the sample.

3. The apparatus of claim 1, further comprising a lower chamber configured to receive the sample and comprising a pressurized gas comprising at least one of air, oxygen, and ozone, the lower chamber separated from the upper chamber.

4. The apparatus of claim 1, wherein the nitrogen gas flow director employs the set of fans to provide non-air nitrogen from a heat sink along the ultraviolet grid lamp, around the upper chamber, and back to the heat sink.

5. The apparatus of claim 1, further comprising a movable sample loader configured to load the sample on the lifting pedestal.

6. The apparatus of claim 5, wherein the movable sample loader comprises a tray that receives the sample from outside the apparatus and the tray moves with the sample to a position on the lifting pedestal.

7. The apparatus of claim 1, wherein a heated tray preheats the sample before energy is applied to the ultraviolet grid lamp.

8. An apparatus for cleaning a sample, comprising:
an upper chamber comprising:
a quantity of non-air nitrogen;
an ultraviolet grid lamp having a forward side and a rear side, the ultraviolet grid lamp emitting ultraviolet light energy from the forward side toward the sample;
a fan arrangement positioned above the ultraviolet grid lamp directing non-air nitrogen in a direction;
an upper chamber forward wall positioned in the direction and forward of the fan arrangement that receives non-air nitrogen from the fan arrangement and deflects the non-air nitrogen downward and over the ultraviolet grid lamp; and
an upper chamber rear wall, wherein the upper chamber rear wall receives non-air nitrogen provided toward the rear side of the ultraviolet grid lamp and deflects non-air nitrogen upward and to the fan arrangement;
wherein the fan arrangement, upper chamber forward wall, and upper chamber rear wall circulate non-air nitrogen around and within the upper chamber and over the rear side of the ultraviolet grid lamp.

9. The apparatus of claim 8, further comprising a lifting pedestal configured to vertically position the sample proximate a quartz plate positioned between the forward side of the ultraviolet grid lamp and the sample.

10. The apparatus of claim 8, wherein the fan arrangement is located within a chamber separate from the sample and comprising a heat sink, wherein the fan arrangement provides non-air nitrogen from the heat sink across the ultraviolet grid lamp, around the chamber, and back to the heat sink.

11. The apparatus of claim 9, further comprising a movable sample loader configured to load the sample on the lifting pedestal.

12. The apparatus of claim 11, wherein the movable sample loader comprises a tray that receives the sample from outside the apparatus and the tray moves with the sample to a position on the lifting pedestal.

13. An apparatus for cleaning a specimen, comprising:
an upper chamber comprising:
a quantity of non-air nitrogen;
an ultraviolet grid lamp having a forward side, the ultraviolet grid lamp providing ultraviolet light energy from its forward side toward the specimen;
a nitrogen gas flow director positioned above the ultraviolet grid lamp that directs non-air nitrogen in a forward direction non-air nitrogen; and
an upper chamber forward wall positioned in the forward direction of the nitrogen gas flow director to receive and deflect the non-air nitrogen downward and over a rear side of the ultraviolet grid lamp;
an upper chamber rear wall, wherein the upper chamber rear wall receives non-air nitrogen provided toward the rear side of the ultraviolet grid lamp and deflects non-air nitrogen upward and to the nitrogen gas flow director;
wherein the nitrogen gas flow director, the upper chamber forward wall, and the upper chamber rear wall are positioned to provide and deflect non-air nitrogen and around and within the upper chamber.

14. The apparatus of claim 13, further comprising a lifting pedestal configured to vertically position the specimen proximate a quartz plate positioned between the forward side of the ultraviolet grid lamp and the specimen.

15. The apparatus of claim 13, wherein the specimen comprises a semiconductor substrate, and application of ultraviolet energy removes photoresist from the semiconductor substrate.

16. The apparatus of claim 13, wherein the nitrogen gas flow director comprises a set of fans and non-air nitrogen passes proximate the ultraviolet grid lamp.

17. The apparatus of claim 16, wherein the nitrogen circulating arrangement of the upper chamber is separate from the specimen and the nitrogen gas flow director employs the set of fans to provide non-air nitrogen from a heat sink across the ultraviolet grid lamp, around the chamber, and back to the heat sink.

18. The apparatus of claim 14, further comprising a movable sample loader configured to load the specimen onto the lifting pedestal.

19. The apparatus of claim 18, wherein the movable sample loader comprises a tray that receives the specimen from outside the apparatus and moves with the specimen to a position on the lifting pedestal.

20. The apparatus of claim 13, wherein a heated tray preheats the specimen before energy is applied to the ultraviolet grid lamp.

* * * * *